United States Patent
Ho

Patent Number: 5,727,761
Date of Patent: Mar. 17, 1998

[54] CIRCUIT BOARD LOCATING DEVICE

[76] Inventor: Hsin Chien Ho, 20F-1, 268, Sec.1, Wen-Hua Road, Pan Chiao City, Taipei, Taiwan

[21] Appl. No.: 606,025

[22] Filed: Sep. 29, 1995

[51] Int. Cl.⁶ .................................................. F16B 4/00
[52] U.S. Cl. ........................... 248/222.12; 248/224.8; 361/758; 411/508
[58] Field of Search ......................... 248/222.12, 300, 248/224.8, 309.1; 174/138 G; 361/742, 758, 759; 403/289, 290, 326, 329; 411/508, 509, 510, 913

[56] References Cited

U.S. PATENT DOCUMENTS

| | | | |
|---|---|---|---|
| 2,727,552 | 12/1955 | Chvosta | 411/913 |
| 2,967,556 | 1/1961 | Jaworski | 411/913 |
| 3,336,828 | 8/1967 | Granger | 411/913 |
| 3,486,158 | 12/1969 | Soltysik et al. | 411/913 |
| 4,818,164 | 4/1989 | Kazyak | 411/508 |

*Primary Examiner*—Ramon O. Ramirez
*Assistant Examiner*—Kimberly T. Wood
*Attorney, Agent, or Firm*—Pro-Techtor International

[57] ABSTRACT

A circuit board locating device for fastening a circuit board to a frame, having two pairs of symmetrical flat legs that extend downward at an outward angle from a top surface of said device and are inserted through a crossed slot on the frame, and a hooked portion raised from a top side thereof and hooked in a retaining hole on the circuit board, each leg having two side boards extending perpendicularly outward from outer edges of a main body of each said leg, a bottom plate stopped at one side of the frame remote from the circuit board, and a space defined between the side boards and the bottom plate and engaged with the periphery of the cross slot of the frame.

1 Claim, 4 Drawing Sheets

CIRCUIT BOARD LOCATING DEVICE

BACKGROUND OF THE INVENTION

The present invention relates to a circuit board locating device that is fastened to a frame to hold a circuit board.

A variety of computers and consumer electronic devices have been developed, and intensively used by people. These devices commonly have circuit boards for transmission of power supply and signals. Conventionally, the circuit board of an electronic apparatus is mounted on female screws on a frame, and secured in place by screws. The circuit board is made having a plurality of mounting holes for connection to the female screws on the frame. This installation procedure is complicated. Furthermore, the circuit board tends to be damaged because too many mounting holes are made thereon.

SUMMARY OF THE INVENTION

The present invention has been accomplished to provide a circuit board locating device which eliminates the aforesaid drawbacks. According to the present invention, the circuit board locating device comprises two pairs of symmetrical flat legs that extend downward at an outward angle from a top surface of said device and are inserted through a crossed slot on the frame, and a hooked portion raised from a top side thereof and hooked in a retaining hole on the circuit board, each leg having two side boards, a outward bottom plate stopped at one side of the frame remote from said circuit board, and a space defined between the side boards and the bottom plate and engaged with the periphery of the cross slot of the frame. The circuit board locating device can be injection-molded from plastics. If the circuit board locating device is to be simhltaneously used as a ground terminal, it can be made from metal by stamping.

DETAILED DESCRIPTION OF THE PREFERRED EMBODIMENT

Figure 1:
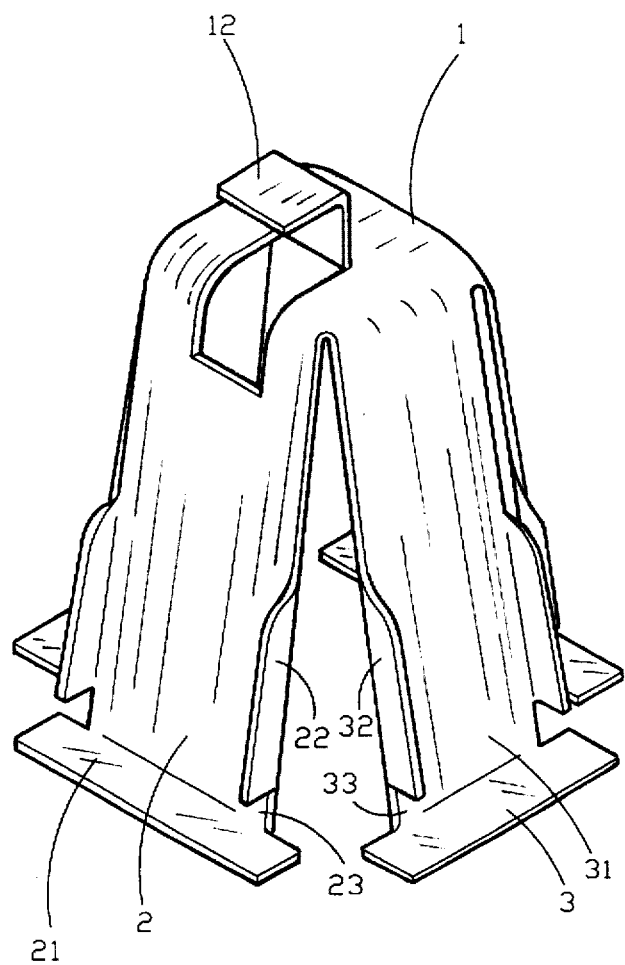
FIG. 1 is an elevational view of a circuit board locating device according to the present invention.
Figure 2:
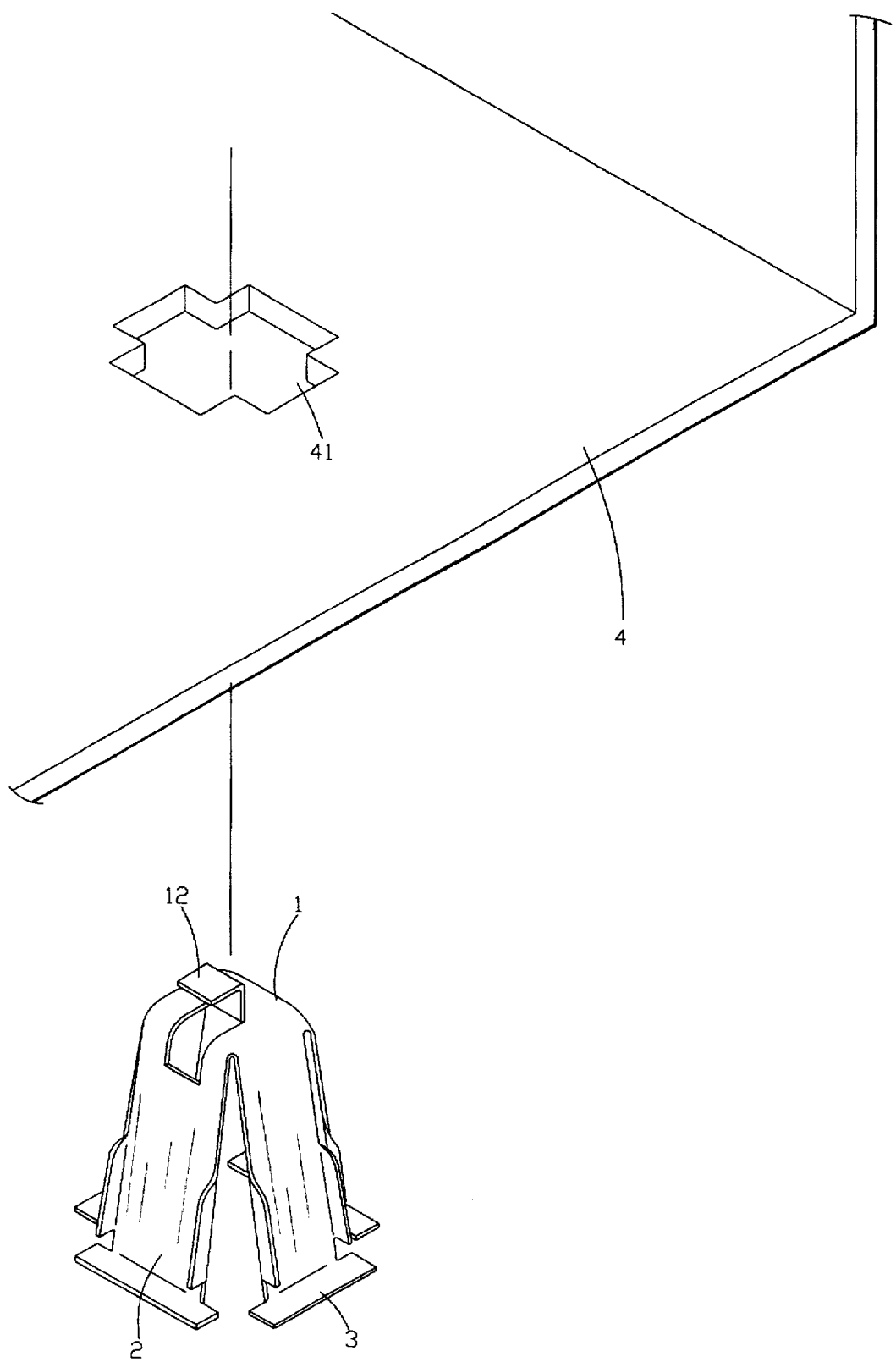
FIG. 2 shows the position of the circuit board locating device relative to the cross slot on the frame according to the present invention.
Figure 3:
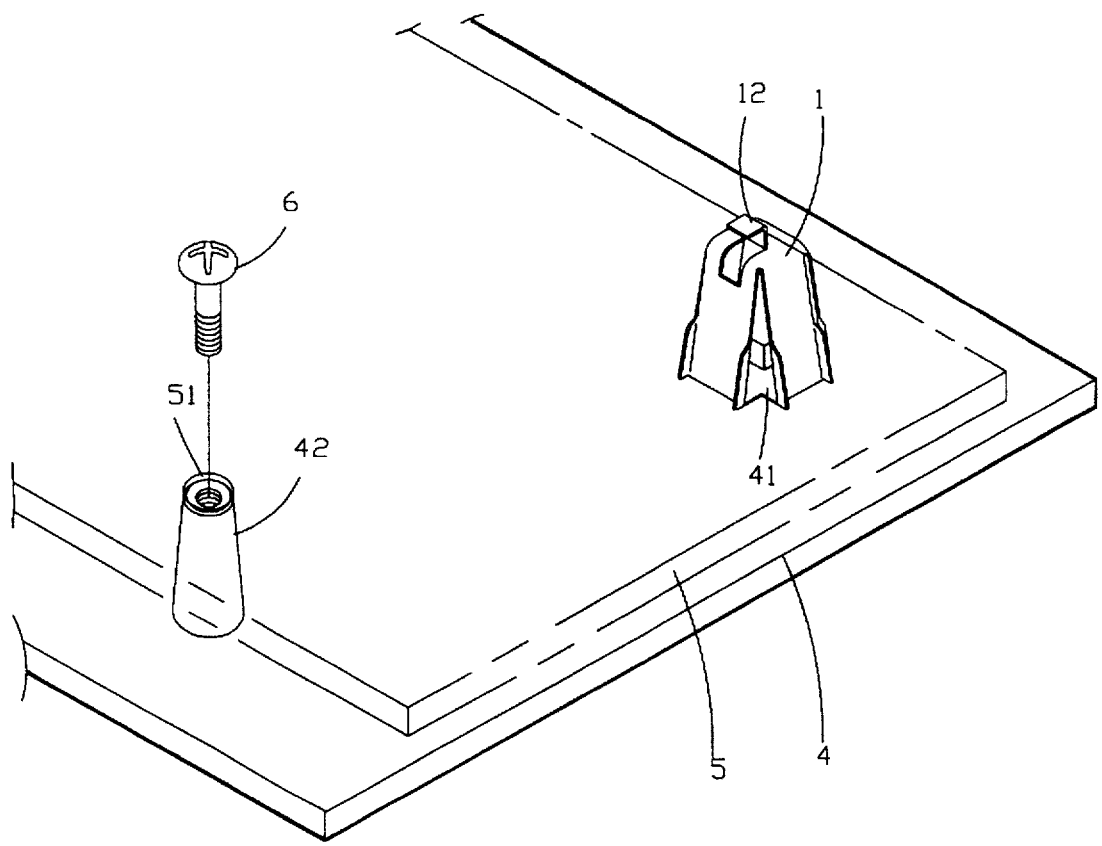
FIG. 3 shows the circuit board attached to the circuit board locating device and the female screw of the frame according to the present invention.
Figure 4:
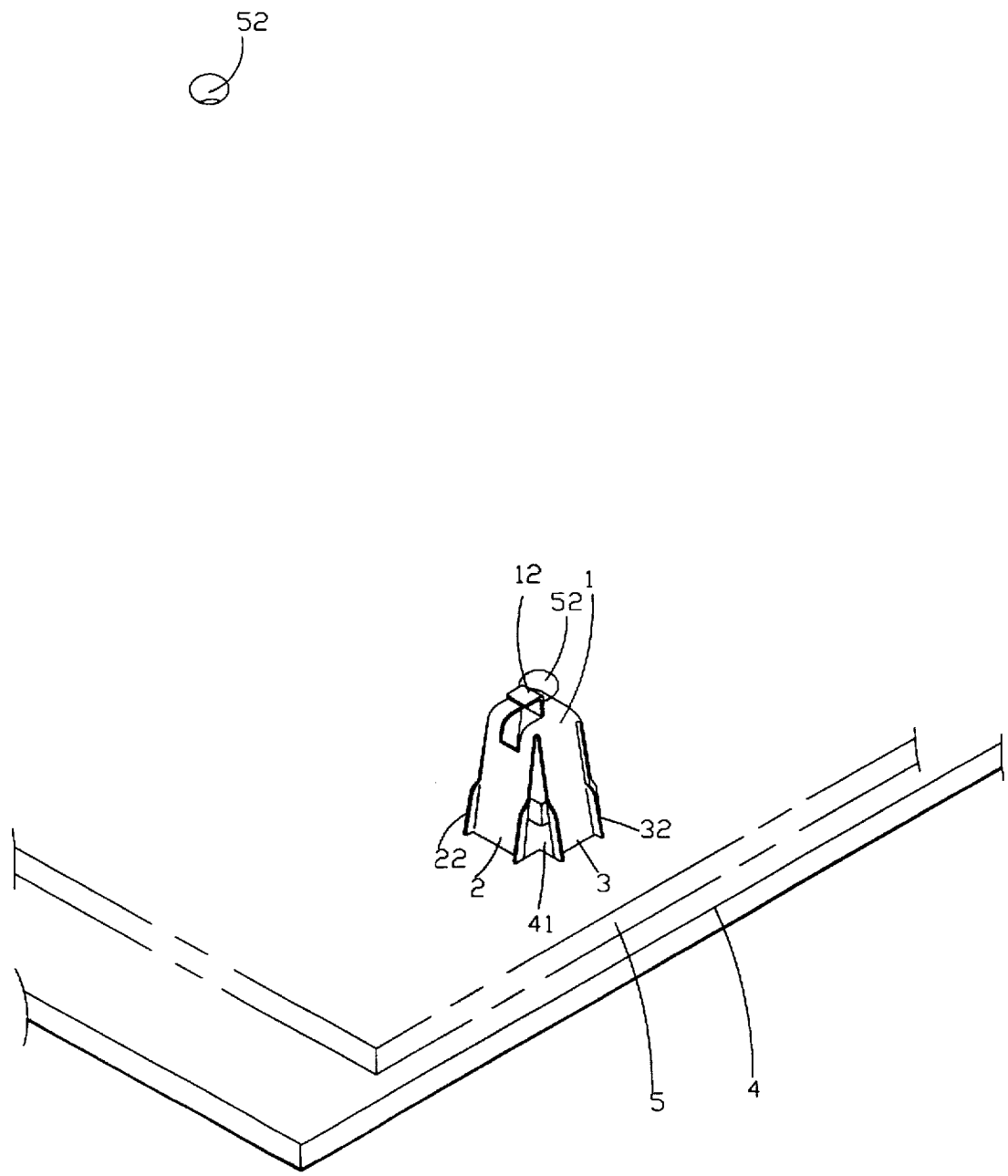
FIG. 4 shows the hooked portion of the circuit board locating device hooked in one retaining hole on the circuit board.

Referring first to FIG. 1, the circuit board locating device, referenced by 1, is made of metal by stamping (as an alternate form of the present invention, the circuit board locating device 1 may be injection-molded from plastics), having two pairs of symmetrical flat legs 2 and 3 that extend downward at an outward angle from a top surface of said device, and a hooked portion 12 raised from the top. Each of the legs 2 and 3 comprises two side boards 22 or 32 extending perpendicularly outward from outer edges of a main body of each said leg, a horizontal bottom plate 21 or 31 extending from a bottom end of each said leg, and a space 23 or 33 defined between the side boards 22 or 32 and the bottom plate 21 or 31.

Referring now to FIGS. 1–4, the frame, referenced by 4, has a cross slot 41, and an upright female screw 42 for connection to a mounting hole 51 on the circuit board 5 above. A circuit board 5 includes a retaining hole 52 corresponding in position to the cross slot 41 on the frame 4. When the circuit board locating device 1 is inserted through the cross slot 41 on the frame 4 from the bottom side (see FIG. 2), the bottom plates 21 and 31 and the side boards 22 and 32 are respectively stopped at two opposite sides of the circuit board 5 with the spaces 23 and 33 respectively engaged with the periphery of the cross slot 41 of the frame 4, the upright female screw 42 is attached to the mounting hole 51 on the circuit board 5 and then fixed in place by a respective screw 6, and the hooked portion 12 is forced into engagement with the retaining hole 52. Therefore, the circuit board 5 is supported on the female screw 42 and the circuit board locating device 1 above the frame 4, and firmly secured in place.

It is to be understood that the drawings are designed for purposes of illustration only, and are not intended as a definition of the limits and scope of the invention disclosed.

I claim:

1. A circuit board locating device for fastening a circuit board to a frame comprising:

two pairs of symmetrical legs that extend downward at an outward angle from a top surface of said locating device, and a hooked portion that is raised from said top surface, adapted to secure said circuit board; wherein each said leg includes two side boards extending perpendicularly outward from outer edges of a main body of each said leg, each said leg further includes a bottom plate positioned to form a frame receiving space between said bottom plate and said side boards, such that said frame is adapted to be received in said frame receiving space of said locating device, thereby capable fixing a position of said circuit board relative to said frame.

* * * * *